US012767855B2

(12) United States Patent
Liang et al.

(10) Patent No.: US 12,767,855 B2
(45) Date of Patent: Oct. 20, 2026

(54) POLISHING COMPOSITIONS AND METHODS OF USE THEREOF

(71) Applicant: Fujifilm Electronic Materials U.S.A., Inc., N. Kingstown, RI (US)

(72) Inventors: Yannan Liang, Gilbert, AZ (US); Bin Hu, Chandler, AZ (US); Hsin Hsien Lu, Hsinchu City (TW)

(73) Assignee: Fujifilm Electronic Materials U.S.A., Inc., N. Kingstown, RI (US)

( * ) Notice: Subject to any disclaimer, the term of this patent is extended or adjusted under 35 U.S.C. 154(b) by 325 days.

(21) Appl. No.: 18/127,053

(22) Filed: Mar. 28, 2023

(65) Prior Publication Data

US 2023/0348754 A1 Nov. 2, 2023

Related U.S. Application Data

(60) Provisional application No. 63/325,652, filed on Mar. 31, 2022.

(51) Int. Cl.

*C09G 1/02* (2006.01)
*H10P 52/40* (2026.01)
*H10W 20/00* (2026.01)

(52) U.S. Cl.

CPC .............. *C09G 1/02* (2013.01); *H10P 52/403* (2026.01); *H10W 20/062* (2026.01)

(58) Field of Classification Search

None

See application file for complete search history.

(56) References Cited

U.S. PATENT DOCUMENTS

2014/0011361 A1 1/2014 Reichardt et al.
2016/0107286 A1* 4/2016 Sakashita ................ B24B 37/00 451/36
2018/0340094 A1 11/2018 Liang et al.
2021/0087431 A1* 3/2021 Liang .................. H01L 21/3212
2021/0253904 A1 8/2021 Huang et al.

FOREIGN PATENT DOCUMENTS

TW 202138502 A 10/2021
TW 202140742 A 11/2021

OTHER PUBLICATIONS

International Search Report and Written Opinion in International Appln. No. PCT/US2023/0165269, mailed on Aug. 31, 2023, 12 pages.
International Preliminary Report on Patentability in International Appln. No. PCT/US2023/016526, mailed on Oct. 10, 2024, 9 pages.
Office Action in Taiwan Appln. No. 112112340, mailed on May 28, 2026, 19 pages (with English translation).

* cited by examiner

*Primary Examiner* — Stephanie P Duclair
(74) *Attorney, Agent, or Firm* — Fish & Richardson P.C.

(57) ABSTRACT

This disclosure relates to polishing compositions containing at least one abrasive, at least one organic acid or a salt thereof, at least one organic solvent in an amount of from about 3% to about 50% by weight of the composition, and an aqueous solvent.

19 Claims, No Drawings

POLISHING COMPOSITIONS AND METHODS OF USE THEREOF

CROSS-REFERENCE TO RELATED APPLICATION

The present application claims priority to U.S. Provisional Application Ser. No. 63/325,652, filed on Mar. 31, 2022, the contents of which are hereby incorporated by reference in their entirety.

BACKGROUND

The semiconductor industry is continually driven to improve chip performance by further miniaturization of devices by process, materials, and integration innovations. Earlier materials innovations included the introduction of copper, replacing aluminum as the conductive material in the interconnect structure, and the use of tantalum (Ta)/tantalum nitride (TaN) as diffusion barrier to separate the Cu conductive material from the non-conductive/insulator dielectric material. Copper (Cu) was chosen as the interconnect material because of its low resistivity and superior resistance against electro-migration.

However, as the features of newer generation chips shrink, the multilayer Cu/barrier/dielectric stacks have to be thinner and more conformal to maintain effective interconnect resistivity in Back End of Line (BEOL). The thinner Cu and the Ta/TaN barrier film schemes present problems with resistivity and flexibility in deposition. For example, with smaller dimensions and advanced manufacturing nodes, resistivity is proceeding to be exponentially worse and improvements in transistor circuit speed (at Front End of Line (FEOL)) are being cut in half by the delay coming from the conductive Cu/Barrier wiring (BEOL). Additionally, with the smaller feature sizes in advanced nodes, defect reduction has become a very difficult technical challenge. Specifically, what were previously considered acceptable amounts of defects can significantly affect the electrical properties, reliability, and yield of semiconductor devices.

Chemical mechanical polishing (CMP) is widely used in the fabrication of integrated circuits to remove the surface irregularities of conductive or dielectric materials on semiconductor wafers, thereby providing a leveled surface for subsequent fabrication steps. During a CMP process, a workpiece, such as a semiconductor wafer, is brought into physical contact with a rotating polishing pad while a polishing composition, also referred to as CMP slurry, is introduced onto the workpiece. The rotating polishing pad and the CMP slurry together remove material from the workpiece until the workpiece has a flat or planar surface. A typical CMP slurry is typically an aqueous suspension containing abrasive particles dispersed in an aqueous medium (e.g., deionized water). Reducing the defects resulting on a substrate surface after CMP processing is a continual challenge.

SUMMARY

This summary is provided to introduce a selection of concepts that are further described below in the detailed description. This summary is not intended to identify key or essential features of the claimed subject matter, nor is it intended to be used as an aid in limiting the scope of the claimed subject matter.

As defined herein, unless otherwise noted, all percentages expressed should be understood to be percentages by weight to the total weight of a polishing composition.

In one aspect, this disclosure features a polishing composition that includes at least one abrasive, at least one organic acid or a salt thereof, at least one organic solvent in an amount of from about 3% to about 50% by weight of the composition, at least one non-ionic surfactant, and an aqueous solvent.

In another aspect, this disclosure features a polishing composition that includes (1) at least one abrasive; (2) at least one organic acid or a salt thereof; (3) at least one organic solvent in an amount of at least about 3% to at most about 50% by weight of the composition, the at least one organic solvent including 2-butanol, t-butyl alcohol, 1-pentanol, 2-pentanol, 3-pentanol, cyclohexanol, 2-propoxyethanol, 2-isopropoxyethanol, 2-butoxyethanol, propylene glycol methyl ether, diethylene glycol butyl ether, ethylene glycol dimethyl ether, ethylene glycol diethyl ether, acetone, acetonitrile, dimethyl sulfoxide, dimethylformamide, dimethylacetamide, tetrahydrofuran, 1-methyl-2-pyrrolidone, 3-methyl-2-oxazolidinone, N,N'-dimethylimidazolidinone, ethylene carbonate, propylene carbonate, glycerol, diethylene glycol, diglyme, dioxane, morpholine, butanone, 2-pentanone, 3-pentanone, monoethanolamine, 2-(2-aminoethoxy) ethanol, 2-amino-2-methyl-1,3-propanediol, 2-amino-2-hydroxymethyl-propane-1,3-diol, piperazine, 1-(2-hydroxyethyl) piperazine, or a mixture thereof; and (4) an aqueous solvent.

In still another aspect, this disclosure features a method that includes applying a polishing composition described herein to a substrate, and bringing a pad into contact with the surface of the substrate and moving the pad in relation to the substrate.

Other aspects and advantages of the claimed subject matter will be apparent from the following description and the appended claims.

DETAILED DESCRIPTION

Embodiments disclosed herein relate generally to compositions and methods to polish substrates used to manufacture semiconductor devices. For example, the compositions disclosed herein may be useful in polishing substrates used in front-end-of-line (FEOL) or back-end-of-line (BEOL) applications. In particular, the compositions disclosed herein can be useful for polishing advanced node films that include at least one of copper, ruthenium, cobalt, molybdenum, titanium and doped derivatives thereof, tungsten and doped derivatives thereof (e.g., $WB_4$), carbides (e.g., BC, $B_4C$, TiC, SiC, and WC), boron-containing materials (e.g., $B_6O$, $BC_2N$, and $AlMgB_{14}$), nitride ceramic materials (e.g., SiN, TiN, and BN), barrier materials (e.g., Ta and TaN), and dielectric materials (e.g., TEOS, low-k materials, and ultra low-k materials).

Currently available CMP compositions are formulations that are highly tailored to the substrates that will be contacted while polishing. Commonly, the formulations are aqueous dispersions of solid abrasives, often containing small amounts of dissolved organic additives (e.g., organic acids, water soluble polymers, surfactants, etc.) in order to achieve the specific polishing performance characteristics (e.g., removal rate selectivities between two materials on the substrate) necessary for the substrates contacted. For example, copper is a relatively soft material and thus easy to aggressively remove if the CMP composition is not specifically formulated with this in mind. Under the same conditions, harder ruthenium features may be removed at too low a rate for practical purposes so a different CMP formulation may be necessary, and the formulation can become even more complicated when both copper and ruthenium films are present on a substrate.

Irrespective of these necessary substrate specific formulation differences, CMP formulations with a high organic solvent content (e.g., greater than about 3 weight percent) are effectively completely avoided due to the higher cost of organic solvents versus water, environmental health and safety concerns (e.g., disposal cost, inhalation during processing, etc.) and potential compatibility issues with the specialized tools used during CMP. However, the present inventors have surprisingly discovered that the use of CMP slurries with a relatively high organic solvent content can actually provide significant defect reduction (among other possible benefits) without substantially reducing the material removal rates (e.g., removal rates for copper and/or dielectric materials) of the CMP slurries, which would render them highly useful for advanced node semiconductor processing. In particular, and as will be described further, copper substrates can benefit from an unexpected and significant reduction in organic residue defect counts when polished with a CMP composition that includes an organic solvent content from about 3% to about 50% by weight.

In one or more embodiments, the polishing composition described herein includes an abrasive; at least one organic acid or a salt thereof, at least one organic solvent in an amount of at least about 3% to at most about 50% by weight of the composition, and an aqueous solvent (e.g., water). In one or more embodiments, the polishing composition can also include at least one of an azole compound and/or at least one non-ionic surfactant. In one or more embodiments, a polishing composition according to the present disclosure can include from about 0.1% to about 50% by weight abrasive, about 0.001% to about 5% by weight organic acid or a salt thereof, at least one organic solvent in an amount of from about 3% to about 50% by weight of the composition, and the remaining percent by weight (e.g., from about 20% to about 97% by weight) of deionized water. In one or more embodiments, the polishing composition can further include from about 0.001% to about 3% by weight azole and/or from about 0.001% to about 2% by weight non-ionic surfactant. In one or more embodiments, the polishing composition can further include from about 0.001% to about 5% by weight oxidizing agent.

In one or more embodiments, the present disclosure provides a concentrated polishing composition that can be diluted with water prior to use by up to a factor of two, or up to a factor of four, or up to a factor of six, or up to a factor of eight, or up to a factor of ten. In other embodiments, the present disclosure provides a point-of-use (POU) polishing composition for use on substrates, comprising the above-described polishing composition, water, and optionally an oxidizer.

In one or more embodiments, a POU polishing composition can include from about 0.1% to about 12% by weight abrasive, from about 0.001% to about 2% by weight organic acid or a salt thereof, from about 3% to about 20% by weight of at least one organic solvent, optionally from about 0.001% to about 5% by weight oxidizer, and the remaining percent by weight (e.g., from about 75% to about 90% by weight) deionized water. In one or more embodiments, the POU polishing composition can further include from about 0.001% to about 1% by weight azole and/or from about 0.001% to about 1% by weight non-ionic surfactant.

In one or more embodiments, a concentrated polishing composition can include from about 1% to about 50% by weight abrasive, from about 0.1% to about 5% by weight organic acid or a salt thereof, from about 10% to about 50% by weight of at least one organic solvent, and the remaining percent by weight (e.g., from about 20% to about 80% by weight) of deionized water. In one or more embodiments, the concentrated polishing composition can further include from about 0.01% to about 3% by weight azole and/or from about 0.01% to about 2% by weight of non-ionic surfactant.

In one or more embodiments, the polishing composition described herein can include at least one (e.g., two or three) abrasive. In some embodiments, the at least one abrasive is selected from the group consisting of cationic abrasives, substantially neutral abrasives, and anionic abrasives. In one or more embodiments, the at least one abrasive is selected from the group consisting of alumina, silica, titania, ceria, zirconia, co-formed products thereof (i.e., co-formed products of alumina, silica, titania, ceria, or zirconia), coated abrasives, surface modified abrasives, and mixtures thereof. In some embodiments, the at least one abrasive does not include ceria. In some embodiments, the at least one abrasive is high-purity, and can have less than about 100 ppm of alcohol, less than about 100 ppm of ammonia, and less than about 100 parts per billion (ppb) of an alkali cation such as sodium cation. The abrasive can be present in an amount of from about 0.1% to about 12% (e.g., from about 0.5% to about 10%), based on the total weight of the POU polishing composition, or any subranges thereof.

In one or more embodiments, the at least one abrasive can have a mean particle size of from at least about 1 nm (e.g., at least about 5 nm, at least about 10 nm, at least about 20 nm, at least about 40 nm, at least about 50 nm, at least about 60 nm, at least about 80 nm, or at least about 100 nm) to at most about 1000 nm (e.g., at most about 800 nm, at most about 600 nm, at most about 500 nm, at most about 400 nm, at most about 200 nm, at most about 150 nm, or at most about 100 nm). As used herein, the mean particle size (MPS) is determined by dynamic light scattering techniques.

In one or more embodiments, the at least one abrasive is in an amount of from at least about 0.1% (e.g., at least about 0.5%, at least about 1%, at least about 2%, at least about 4%, at least about 5%, at least about 10%, at least about 12%, at least about 15%, or at least about 20%) by weight to at most about 50% (e.g., at most about 45%, at most about 40%, at most about 35%, at most about 30%, at most about 25%, at most about 20%, at most about 15%, at most about 12%, at most about 10%, or at most about 5%) by weight of the polishing composition described herein.

In one or more embodiments, the polishing composition described herein can include at least one (e.g., two or three) organic acid or a salt thereof. In some embodiments, the at least one organic acid or a salt thereof are selected from the group consisting of a carboxylic acid, an amino acid, a sulfonic acid, a phosphonic acid, and salts and mixtures thereof. In more specific embodiments, the at least one organic acid is selected from the group consisting of gluconic acid, lactic acid, citric acid, tartaric acid, malic acid, glycolic acid, malonic acid, formic acid, oxalic acid, acetic acid, propionic acid, peracetic acid, succinic acid, lactic acid, amino acetic acid, phenoxyacetic acid, bicine, diglycolic acid, glyceric acid, tricine, alanine, histidine, valine, phenylalanine, proline, glutamine, aspartic acid, glutamic acid, arginine, lysine, glycine, arginine, tyrosine, benzoic acid, 1,2-ethanedisulfonic acid, 4-amino-3-hydroxy-1-naphthalenesulfonic acid, 8-hydroxyquinoline-5-sulfonic acid, aminomethanesulfonic acid, benzenesulfonic acid, hydroxylamine O-sulfonic acid, methanesulfonic acid, m-xylene-4-sulfonic acid, poly(4-styrenesulfonic acid), polyanethole-sulfonic acid, p-toluenesulfonic acid, trifluoromethane-sulfonic acid, phosphonic acid, hydroxyethylidene diphosphonic acid, 2-phosphono-1,2,4-butane tricarboxylic acid, aminotrimethylene phosphonic acid, hexamethylene-diamine tetra(methylenephosphonic acid), bis(hexamethyl-ene)triamine phosphonic acid, ethylenediaminetetracetic acid, iminodiacetic acid, N-hydroxyethyl-ethylenediamin-etriacetic acid, nitrilotriacetic acid, diethylenetriaminepen-tacetic acid, hydroxyethylethylenediaminetriacetic acid, tri-ethylenetetraaminehexaacetic acid, diaminocycloheanetetraacetic acid, nitrilotrimethylphos-phonic acid, ethylenediaminetetra(methylenephosphonic acid), 1-hydroxyl ethylidene-1,1-diphosphonic acid, dieth-ylenetriamine penta(methylene phosphonic acid), and mix-tures thereof. Without wishing to be bound by theory, it is believed that the organic acid (such as those described above) can be used as an effective barrier film (e.g., metal) removal rate enhancer in the polishing compositions described herein to improve the removal rate of barrier film in a semiconductor substrate.

In one or more embodiments, the at least one organic acid or a salt thereof is in an amount of from at least about 0.001% (e.g., at least about 0.005%, at least about 0.01%, at least about 0.05%, at least about 0.1%, at least about 0.5%, at least about 1%, at least about 1.5%, at least about 2%, at least about 2.5%, at least about 3%, or at least about 3.5%) by weight to at most about 5% (e.g., at most about 4%, at most about 3%, at most about 2%, at most about 1%, at most about 0.5%, at most about 0.1%, at most about 0.05%, or at most about 0.01%) by weight of the polishing composition described herein.

In one or more embodiments, at least one (e.g., two or three) organic solvent can be used in the polish composition (e.g., the POU or concentrated polishing composition) of the present disclosure. In one or more embodiments, the organic solvent can be a water-soluble organic solvent. As used herein, a "water-soluble" substance (e.g., a water-soluble solvent) refers to a substance having a solubility of at least 1% by weight in water at 25° C. In one or more embodi-ments, the at least one organic solvent can have a polarity index of from at least about 2 (e.g., at least about 3, at least 4, or at least about 5) to at most about 10 (e.g., at most about 9, at most about 8, at most about 7, at most about 6, or at most about 5). In one or more embodiments, the at least one organic solvent can be one or more alcohols, alkylene glycols, alkylene glycol ethers, ethers, esters, ketones, nitriles, sulfoxides, urethanes, ureas, amines, alkanolamines, amides, carbonyls, carbonates, aromatic hydrocarbons, or halogenated hydrocarbons. In one or more embodiments, the at least one organic solvent includes one or more solvents selected from the group consisting of methanol, ethanol, 1-propanol, 2-propanol, 1-butanol, 2-butanol, t-butyl alco-hol, 1-pentanol, 2-pentanol, 3-pentanol, cyclohexanol, eth-ylene glycol, propylene glycol, 2-methoxyethanol, 2-ethoxyethanol, 2-propoxyethanol, 2-isopropoxyethanol, 2-butoxyethanol, propylene glycol methyl ether, propylene glycol propyl ether, diethylene glycol butyl ether, ethylene glycol dimethyl ether, ethylene glycol diethyl ether, acetone, acetonitrile, dimethyl sulfoxide, dimethylformamide, dim-ethylacetamide, tetrahydrofuran, 1-methyl-2-pyrrolidone, 3-methyl-2-oxazolidinone, N,N'-dimethylimidazolidinone, ethylene carbonate, propylene carbonate, glycerol, diethyl-ene glycol, diglyme, dioxane, morpholine, butanone, 2-pen-tanone, 3-pentanone, monoethanolamine, 2-(2-aminoeth-oxy) ethanol, 2-amino-2-methyl-1,3-propanediol, 2-amino-2-hydroxymethyl-propane-1,3-diol, piperazine, 1-(2-hydroxyethyl) piperazine, and any mixtures thereof.

In some embodiments, the at least one organic solvent is in an amount of from at least about 3% (e.g., at least about 4%, at least about 5%, at least about 6%, at least about 7%, at least about 8%, at least about 9%, at least about 10%, at least about 11%, at least about 12.5%, at least about 15%, at least about 16%, at least about 17.5%, at least about 18%, at least about 20%, at least about 22.5%, at least about 25%, at least about 30%, at least about 35%, or at least about 40%) by weight to at most about 50% (e.g., at most about 45%, at most about 40%, at most about 35%, at most about 30%, at most about 25%, at most about 20%, at most about 17.5%, at most about 15%, at most about 12.5%, at most about 10%, at most about 7.5%, or at most about 5%) by weight of the polishing composition described herein.

In one or more embodiments, the polishing composition described herein can include an aqueous solvent, such as water (e.g., deionized water). In some embodiments, the aqueous solvent is in an amount of from at least 50% (e.g., at least about 55%, at least about 60%, at least about 65%, at least about 70%, at least about 75%, at least about 80%, or at least about 85%) by weight to at most about 97% (e.g., at most about 95%, at most about 90%, at most about 85%, at most about 80%, at most about 75%, at most about 70%, at most about 65%, at most about 60%, or at most about 55%) by weight of the polishing composition described herein.

In one or more embodiments, the polishing composition described herein can optionally include at least one (e.g., two or three) azole compound. In some embodiments, the azole compound can be used as a corrosion inhibitor, such as a metal (copper) corrosion inhibitor. In some embodi-ments, the at least one azole compound is selected from the group consisting of substituted or unsubstituted triazoles, substituted or unsubstituted tetrazoles, substituted or unsub-stituted benzotriazoles, substituted or unsubstituted pyra-zoles, substituted or unsubstituted imidazoles, substituted or unsubstituted benzimidazoles, substituted or unsubstituted thiadiazoles, substituted or unsubstituted adenines, substi-tuted or unsubstituted xanthines, and substituted or unsub-stituted guanines. In one or more embodiments, the azole compound can be selected from the group consisting of 1,2,4-triazole, 1,2,3-triazole, tetrazole, benzotriazole, tolyl-triazole, methyl benzotriazole (e.g., 1-methyl benzotriazole, 4-methyl benzotriazole, or 5-methyl benzotriazole), ethyl benzotriazole (e.g., 1-ethyl benzotriazole), propyl benzotri-azole (e.g., 1-propyl benzotriazole), butyl benzotriazole (e.g., 1-butyl benzotriazole or 5-butyl benzotriazole), pentyl benzotriazole (e.g., 1-pentyl benzotriazole), hexyl benzotri-azole (e.g., 1-hexyl benzotriazole or 5-hexyl benzotriazole), dimethyl benzotriazole (e.g., 5,6-dimethyl benzotriazole), chloro benzotriazole (e.g., 5-chloro benzotriazole), dichloro benzotriazole (e.g., 5,6-dichloro benzotriazole), chlorom-ethyl benzotriazole (e.g., 1-(chloromethyl)-1-H-benzotriaz-ole), chloroethyl benzotriazole, phenyl benzotriazole, ben-zyl benzotriazole, aminotriazole, aminobenzimidazole, aminotetrazole, pyrazole, imidazole, adenine, xanthine, gua-nine, benzimidazole, thiabendazole, 1-hydroxybenzotriaz-ole, 2-methylbenzothiazole, 2-aminobenzimidazole, 2-amino-5-ethyl-1,3,4-thiadiazole, 3,5-diamino-1,2,4-triaz-ole, 3-amino-5-methylpyrazole, 4-amino-4H-1,2,4-triazole, and mixtures thereof. In one or more embodiments, the composition can include benzotriazole and/or a substituted benzotriazole. Without wishing to be bound by theory, it is believed that an azole compound (such as those described above) can significantly reduce or minimize the removal rate of metals (e.g., copper) in a semiconductor substrate.

In some embodiments, the at least one azole compound is in an amount of from at least about 0.001% (e.g., at least about 0.002%, at least about 0.005%, at least about 0.01%, at least about 0.02%, at least about 0.05%, at least about 0.1%, at least about 0.2%, at least about 0.5%, at least about 1%, or at least about 2%) by weight to at most about 3% (e.g., at most about 2%, at most about 1%, at most about 0.8%, at most about 0.6%, at most about 0.5%, at most about 0.4%, at most about 0.2%, at most about 0.1%, at most about 0.05%, at most about 0.02%, at most about 0.01%, or at most about 0.005%) by weight of the polishing composition described herein.

In one or more embodiments, the polishing composition described herein can optionally include at least one (e.g., two or three) pH adjusting agent (e.g., a base). In some embodiments, the at least one pH adjusting agent is selected from the group consisting of ammonium hydroxide, sodium hydroxide, potassium hydroxide, cesium hydroxide, monoethanolamine, diethanolamine, triethanolamine, methylethanolamine, methyldiethanolamine, tetrabutylammonium hydroxide, tetrapropylammonium hydroxide, tetraethylammonium hydroxide, tetramethylammonium hydroxide, ethyltrimethylammonium hydroxide, diethyldimethylammonium hydroxide, dimethyldipropylammonium hydroxide, benzyltrimethylammonium hydroxide, tris(2-hydroxyethyl) methylammonium hydroxide, choline hydroxide, and any combinations thereof.

In one or more embodiments, the at least one pH adjusting agent is in an amount of from at least about 0.01% (e.g., at least about 0.05%, at least about 0.1%, at least about 0.5%, at least about 1%, or at least about 1.5%) by weight to at most about 2% (e.g., at most about 1.5%, at most about 1%, at most about 0.5%, at most about 0.2%, or at most about 0.1%) by weight of the polishing composition described herein.

In one or more embodiments, the polishing composition described herein can be either acidic or basic. In some embodiments, the pH value of the polishing composition can range from at least about 2 (e.g., at least about 2.5, at least about 3, at least about 3.5, at least about 4, at least about 4.5, at least about 5, at least about 5.5, at least about 6, at least about 6.5, at least about 7, at least about 7.5, at least about 8, at least about 8.5, at least about 9, at least about 9.5, at least about 10, at least about 10.5, at least about 11, at least about 11.5, or at least about 12) to at most about 13 (e.g., at most about 12.5, at most about 12, at most about 11.5, at most about 11, at most about 10.5, at most about 10, at most about 9.5, at most about 9, at most about 8.5, at most about 8, at most about 7.5, at most about 7, at most about 6.5, at most about 6, at most about 5.5, at most about 5, at most about 4.5, at most about 4, at most about 3.5, at most about 3, or at most about 2.5). In one or more embodiments, an alkaline pH value may be preferred. In one or more embodiments, an acidic pH value may be preferred. In order to obtain the desired pH, the relative concentrations of the ingredients in the polishing compositions described herein can be adjusted.

In one or more embodiments, the polishing composition described herein can optionally include at least one (e.g., two or three) non-ionic surfactant. In one or more embodiments, the at least one non-ionic surfactant is selected from the group consisting of alcohol alkoxylates, alkylphenol alkoxylates, tristyrylphenol alkoxylates, sorbitan ester alkoxylates, polyalkoxylates, polyalkylene oxide block copolymers, alkoxylated diamines, and mixtures thereof. In one or more embodiments, the non-ionic surfactant does not include an alkylphenol alkoxylate. In one or more embodiments, the non-ionic surfactant is a polymer having a number average molecular weight of from at least about 500 g/mol (e.g., at least about 1,000 g/mol, at least about 2,500 g/mol, at least about 5,000 g/mol, at least about 7,500 g/mol, at least about 10,000 g/mol) to at most about 1,000,000 g/mol (e.g., at most about 750,000 g/mol, at most about 500,000 g/mol, at most about 250,000 g/mol, or at most about 100,000 g/mol). In one or more embodiments, the alkoxylate groups of the alkoxylated non-ionic surfactants are ethoxylate, propoxylate, or a combination of ethoxylate and propoxylate groups. Without wishing to be bound by theory, it is surprising that a non-ionic surfactant (such as those described above) can be used as a low-k removal rate inhibitor in the polishing composition described herein to reduce or minimize the removal rate of a low-k film or material (e.g., a carbon doped silicon oxide film) in a semiconductor substrate.

In some embodiments, the at least one non-ionic surfactant is in an amount of from at least about 0.001% (e.g., at least about 0.005%, at least about 0.01%, at least about 0.05%, at least about 0.1%, at least about 0.5%, at least about 1%, or at least about 1.5%) by weight to at most about 2% (e.g., at most about 1.5%, at most about 1%, at most about 0.5%, at most about 0.1%, at most about 0.05%, or at most about 0.01%) by weight of the polishing composition described herein.

An optional oxidizer (or oxidizing agent) can be added when diluting a concentrated slurry to form a POU slurry. The oxidizer can be selected from the group consisting of hydrogen peroxide, orthoperiodic acid, metaperiodic acid, dimesoperiodic acid, diorthoperiodic acid, ammonium periodate, potassium periodate, sodium periodate, ammonium persulfate, iodic acid, iodate salt, perchloric acid, perchloroate salt, hydroxylamine and hydroxylamine salts, and any combinations thereof. In one or more embodiments, the oxidizer can be hydrogen peroxide.

In some embodiments, the oxidizer is in an amount of from at least about 0.001% (e.g., at least about 0.002%, at least about 0.004%, at least about 0.005%, at least about 0.01%, at least about 0.025%, at least about 0.05%, at least about 0.075%, at least about 0.1%, at least about 0.5%, at least about 1%, or at least about 2%) by weight to at most about 5% (e.g., at most about 4.5%, at most about 4%, at most about 3.5%, at most about 3%, at most about 2.5%, at most about 2%, at most about 1.5%, at most about 1%, at most about 0.5%, or at most about 0.1%) by weight of the polishing composition described herein. In some embodiments, without wishing to be bound by theory, it is believed that the oxidizer can help remove a hard mask material in a hard mask containing substrate.

In one or more embodiments, the polishing composition described herein can optionally include at least one (e.g., two or three) chelating agent. In some embodiments, the at least one optional chelating agent can be an amino-containing carboxylic acid (e.g., a polyaminopolycarboxylic acid) or a phosphonic acid. In some embodiments, the at least one chelating agent is selected from the group consisting of ethylenediaminetetracetic acid, iminodiacetic acid, N-hydroxyethyl-ethylenediaminetriacetic acid, nitrilotriacetic acid, diethylenetriaminepentacetic acid, hydroxyethylethylenediaminetriacetic acid, triethylenetetraaminehexaacetic acid, diaminocycloheanetetraacetic acid, nitrilotrimethylphosphonic acid, ethylenediaminetetra(methylenephosphonic acid), 1-hydroxyl ethylidene-1,1,-diphosphonic acid, diethylenetriamine penta(methylene phosphonic acid), and combinations thereof. Without wishing to be bound by theory, it is believed that including a chelating agent (such as those described above) in the polishing composition described herein can significantly reduce or minimize the observed defects on a semiconductor substrate (such as the defects on a surface of a copper wafer).

In one or more embodiments, the at least one chelating agent is in an amount of from at least about 0.001% (e.g., at least about 0.002%, at least about 0.005%, at least about 0.01%, at least about 0.02%, at least about 0.05%, at least about 0.1%, at least about 0.2%, or at least about 0.5%) by weight to at most about 1% (e.g., at most about 0.8%, at most about 0.6%, at most about 0.5%, at most about 0.4%, at most about 0.2%, at most about 0.1%, at most about 0.05%, at most about 0.02%, at most about 0.01%, or at most about 0.005%) by weight of the polishing composition described herein.

In one or more embodiments, the polishing composition described herein can optionally include at least one (e.g., two or three) water-soluble polymer. Examples of suitable water-soluble polymers include polyacrylamide, polyvinyl alcohol, polyvinylpyrrolidone, polyacrylic acid, hydroxyethyl cellulose, and copolymers thereof. Without wishing to be bound by theory, it is believed that the water-soluble polymer can serve as a removal rate inhibitor to reduce the removal rate of certain exposed materials on a substrate that do not intend to be removed or should be removed at a lower removal rate during the polishing process.

In one or more embodiments, the at least one water-soluble polymer can be from at least about 0.01% (e.g., at least about 0.02%, at least about 0.03%, at least about 0.04%, at least about 0.05%, at least about 0.06%, at least about 0.07%, at least about 0.08%, at least about 0.09%, or at least about 0.1%) by weight to at most about 1% (e.g., at most about 0.8%, at most about 0.6%, at most about 0.5%, at most about 0.4%, at most about 0.2%, at most about 0.1%, at most about 0.08%, at most about 0.06%, or at most about 0.05%) by weight of the polishing composition described herein.

In one or more embodiments, the polishing composition described herein can be substantially free of one or more of certain ingredients, such as pH adjusting agents, quaternary ammonium compounds (e.g., salts such as tetraalkylammonium salts and hydroxides such as tetramethylammonium hydroxide), alkali bases (such as alkali hydroxides), fluorine-containing compounds (e.g., fluoride compounds or fluorinated compounds (such as fluorinated polymers/surfactants)), silicon-containing compounds such as silanes (e.g., alkoxysilanes or inorganic silicates), nitrogen containing compounds (e.g., amino acids, amines, imines (e.g., amidines such as 1,8-diazabicyclo[5.4.0]-7-undecene (DBU) and 1,5-diazabicyclo[4.3.0]non-5-ene (DBN)), amides, or imides), salts (e.g., halide salts or metal salts), polymers (e.g., non-ionic, cationic, or anionic polymers), inorganic acids (e.g., hydrochloric acid, sulfuric acid, phosphoric acid, or nitric acid), surfactants (e.g., cationic surfactants, anionic surfactants, or non-ionic surfactants), plasticizers, oxidizing agents (e.g., periodic acid and periodic acid), corrosion inhibitors (e.g., azole or non-azole corrosion inhibitors), electrolytes (e.g., polyelectrolytes), and/or certain abrasives (e.g., polymer abrasives, fumed silica, ceria abrasives, non-ionic abrasives, surface modified abrasives, negatively/positively charged abrasives, or ceramic abrasive composites). The halide salts that can be excluded from the polishing compositions include alkali metal halides (e.g., sodium halides or potassium halides) or ammonium halides (e.g., ammonium chloride), and can be fluorides, chlorides, bromides, or iodides. As used herein, an ingredient that is "substantially free" from a polishing composition refers to an ingredient that is not intentionally added into the polishing composition. In some embodiments, the polishing composition described herein can have at most about 1000 ppm (e.g., at most about 500 ppm, at most about 250 ppm, at most about 100 ppm, at most about 50 ppm, at most about 10 ppm, or at most about 1 ppm) of one or more of the above ingredients that are substantially free from the polishing composition. In some embodiments, the polishing compositions described herein can be completely free of one or more of the above ingredients.

The present disclosure also contemplates a method of using any of the above-described polishing compositions (e.g., concentrates or POU slurries). With the concentrate, the method can comprise the steps of diluting the concentrate to form a POU slurry (e.g., by a factor of at least two), and then contacting a substrate surface with the POU slurry. In some embodiments, an oxidizer can be added to the slurry before, after, or during the dilution. With the POU slurry, the method comprises the step of contacting the substrate surface with the slurry.

In one or more embodiments, this disclosure features a polishing method that can include applying a polishing composition according to the present disclosure to a substrate (e.g., a wafer); and bringing a pad into contact with the surface of the substrate and moving the pad in relation to the substrate. In some embodiments, the substrate can include copper, cobalt, ruthenium, or a combination thereof. For example, the substrate can include copper in combination with cobalt or ruthenium. Further, in some embodiments, after polishing a substrate with a polishing composition described herein, the polished substrate can undergo a rinse polishing process where a composition including all the components of the polishing composition described herein, except the abrasive, is applied to the polished substrate in the polishing tool and the pad of the polishing tool is brought into contact with the substrate and moved in relation to the substrate to create a rinse polished substrate. In some embodiments, after the polishing process or the rinse polishing process, the substrate can be removed from the polishing tool and subjected to a post-CMP cleaning in a cleaning tool (e.g., a brush scrubber or a spin rinse dryer).

In some embodiments, the above method can effectively polish a substrate without significant corrosion or undesirable removal rate selectivity, while improving defectivity performance. In one or more embodiments, the copper removal rate is less than about 500 Å/min, or less than about 400 Å/min, or less than about 300 Å/min, or less than about 200 Å/min, less than about 150 Å/min, or less than about 125 Å/min, or less than about 100 Å/min, or less than about 90 Å/min, or less than about 80 Å/min, or less than about 70 Å/min. In one or more embodiments, the static etch rate (SER) for a 2 cm×2 cm copper coupon incubated with a polishing composition for 5 minutes at 45° C. according to the present disclosure is less than about 10 Å/min, or less than about 8 Å/min, or less than about 6 Å/min, or less than about 5 Å/min, or less than about 4 Å/min, less than about 3.5 Å/min, or less than about 2 Å/min, or less than about 2.5 Å/min. In one or more embodiments, the ruthenium removal rate is from at least about 3 Å/min (e.g., at least about 5 Å/min, at least about 15 Å/min, at least about 25 Å/min, at least about 35 Å/min, at least about 45 Å/min, or at least about 55 Å/min) to at most about 100 Å/min (e.g., at most about 90 Å/min, at most about 80 Å/min, at most about 70 Å/min, at most about 60 Å/min, or at most about 50 Å/min). In one or more embodiments, the ratio of the copper polishing rate to the ruthenium polishing rate (Cu:Ru) is at most about 35:1, or at most about 30:1, or at most about 25:1, or at most about 20:1, or at most about 15:1, or at most about 10:1, at most about 5:1, or at most about 4:1, or at most about 3:1, or at most about 2.5:1, or at most about 2:1, or at most about 1.5:1, or at most about 1:1. In one or more embodiments, the total defect counts (TDC), measured by any known defect measurement device (e.g., a a KLA-Tencor AIT-XUV) on a 300 mm diameter copper blanket wafer after polishing with a composition according to the present disclosure can be less than 5000 (e.g., less than 3000, less than 2000, less than 1000, less than 500, or less than 100).

It is to be noted that the term "silicon oxide" described herein is expressly intended to include both un-doped and doped versions of silicon oxide. For example, in one or more embodiments, the silicon oxide can be doped with at least one dopant selected from carbon, nitrogen, hydrogen, phosphorous, boron, or any other known dopants for silicon oxide. Some examples of silicon oxide film types include TEOS (tetra-ethyl orthosilicate), SiOC, SiOCN, SiOCH, SiOH and SiON.

In some embodiments, the method that uses a polishing composition described herein can further include forming or producing a semiconductor device from the substrate treated by the polishing composition through one or more steps. For example, photolithography, ion implantation, dry/wet etching, plasma etching, deposition (e.g., PVD, CVD, ALD, ECD), wafer mounting, die cutting, packaging, and testing can be used to produce a semiconductor device from the substrate treated by the polishing composition described herein.

The specific examples below are to be construed as merely illustrative, and not limitative of the remainder of the disclosure in any way whatsoever. Without further elaboration, it is believed that one skilled in the art can, based on the description herein, utilize the present invention to its fullest extent.

EXAMPLES

In these examples, the polishing was performed using an AMAT Reflexion CMP polisher, a Fujibo soft pad, a down-force pressure of 1.5 psi, and a slurry flow rate between 100 and 400 mL/min.

The general compositions used in the examples below are shown in Table 1 below. The specifics details on the differences in the compositions tested will be explained in further detail when discussing the respective examples.

TABLE 1

| Component | % By Weight of Composition |
|---|---|
| pH adjusting agent (base) | 0.05-5% |
| Organic Acid | 0.01-1% |
| Non-ionic Surfactant | 0.001-1% |
| Azole Compound | 0.001-0.5% |
| Organic Solvent | Less than 0.2% or 3-15% |
| Abrasive (silica) | 0.1-12% |
| Oxidizer ($H_2O_2$) | 0.1-5% |
| Solvent (DI Water) | 70-90% |
| pH | 7-13 |

Example 1

Table 2 below shows contact angle measurements on Cu and Black Diamond 1 (BD-1) blanket wafers for Compositions 1-5. Table 2 also shows removal rate measurements for Cu, BD-1, and TEOS blanket wafers when polishing using Compositions 1-5. Composition 1 included less than 0.2% by weight of organic solvent 1. Compositions 2-5 contained the same ingredients at the same concentrations as Composition 1 except that each of Compositions 2-5 also included an organic solvent (i.e., organic solvents 1-4) in an amount greater than 3% by weight of the composition, where the DI water was reduced to account for the increase in organic solvent. Organic solvents 1~4 were different from one another with two being alcohols, one being a lactam, and one being a polar aprotic solvent. The BD-1 blanket wafer is a low-k dielectric material (i.e., carbon doped silicon oxides) coated on silicon wafers.

The results showed surprisingly that the increase in the amount of organic solvent used in Compositions 2-5 compared to Composition 1 reduced the Cu and BD-1 contact angle (e.g., as shown by Composition 2) or substantially kept the Cu contact angle. A reduced Cu contact angle can be preferred for a copper surface in barrier polishing applications as it increases the wetting of the surface by the composition. Further, compared to Composition 1, the increase in organic solvent content had no significant impact on the copper removal rate. Although the BD-1 and TEOS removal rates showed more change compared to the Cu removal rate, these changes were not significant enough to impact the final performance of the polishing composition.

TABLE 2

| | Comp. 1 | Comp. 2 | Comp. 3 | Comp. 4 | Comp. 5 |
|---|---|---|---|---|---|
| Organic Solvent | Organic Solvent 1 (<0.2 wt %) | Organic Solvent 1 (>3 wt %) | Organic Solvent 2 (>3 wt %) | Organic Solvent 3 (>3 wt %) | Organic Solvent 4 (>3 wt %) |
| Cu Contact Angle (°) | 55 | 43.4 | 56.2 | 58.6 | 58.6 |
| BD-1 Contact Angle (°) | 20.2 | 10.1 | 15.6 | 13.6 | 13.8 |
| Cu RR (Å/min) | 35 | 39 | 44 | 47 | 36 |
| BD-1 RR (Å/min) | 20 | 89 | 51 | 49 | 32 |
| TEOS RR (Å/min) | 66 | 53 | 55 | 57 | 60 |

RR = removal rate

Example 2

Table 3 below shows static etch rate (SER) and electrochemistry measurements for Compositions 1~4 (described above). The SER measurements were performed by placing a coupon of Cu, Co, or Ru in the polishing composition for 5 minutes at 60° C. and then measuring the ppb of the metal in the polishing composition by ICP-MS. The electrochemistry measurements were performed using a potentiostat at room temperature; the metal coupon was used as the working electrode, graphite as the counter electrode, and Ag/AgCl as the reference electrode.

The results showed that surprisingly the increase in organic solvent content had only a marginal impact on the SER and the electrochemistry measurements, which suggests that the relatively large amount of organic solvent did not substantially increase the corrosiveness of the CMP compositions. Compositions 2 and 3 did show a lower Cu Ecorr, which may be due to the formation of a loosely-bound passivation layer.

TABLE 3

| | Comp. 1 | Comp. 2 | Comp. 3 | Comp. 4 |
|---|---|---|---|---|
| Organic Solvent | Organic Solvent 1 (<0.2 wt %) | Organic Solvent 1 (>3 wt %) | Organic Solvent 2 (>3 wt %) | Organic Solvent 3 (>3 wt %) |
| Cu SER (ppb) | 20 | 16 | 20 | 10 |
| Co SER (ppb) | 1.3 | <1 | <1 | <1 |
| Ru SER (ppb) | <0.1 | <0.1 | <0.1 | <0.1 |
| Cu Ecorr. (mV) | 43.21 | −5.15 | −10.68 | 59.63 |
| Cu Icorr. (mV) | 0.01 | 0.09 | 0.03 | 0.02 |
| Co Ecorr. (mV) | 156.56 | 148.59 | 149.48 | 136.63 |
| Co Icorr. (mV) | 2.25 | 2.43 | 4.45 | 6.74 |
| Ru Ecorr. (mV) | 50.04 | 74.82 | 41.55 | 48.43 |
| Ru Icorr. (mV) | 34.37 | 32.50 | 30.54 | 32.18 |

Example 3

Table 4 shows the solubility of metal oxides in Compositions 1-5 (described above). The metal oxide solubility was performed by placing 20 mg of $Cu_2O$, $Co_3O_4$, or $RuO_2$ in 25 g of a polishing composition at 45° C. for five minutes under static conditions, and then measuring the amount of Cu, Co, or Ru in the supernatant by ICP-MS.

The results showed that surprisingly the increase in the amount of organic solvent was able to enhance copper oxide dissolution, which indicates that any copper oxides present or formed during the polishing can be increasingly removed in the presence of a polishing composition that includes higher levels of organic solvent. Further, Composition 4 also increased the ruthenium oxide and cobalt oxide solubility relative to the other compositions tested.

TABLE 4

| | Comp. 1 | Comp. 2 | Comp. 3 | Comp. 4 | Comp. 5 |
|---|---|---|---|---|---|
| Organic Solvent | Organic Solvent 1 (<0.2 wt %) | Organic Solvent 1 (>3 wt %) | Organic Solvent 2 (>3 wt %) | Organic Solvent 3 (>3 wt %) | Organic Solvent 4 (>3 wt %) |
| Cu (ppb) | 3620 | 8371 | 4010 | 7387 | 5679 |
| Co (ppb) | 382 | 50 | 32 | 184 | 37 |
| Ru (ppb) | 0.2 | 0.2 | 0.2 | 23.9 | 0.2 |

Example 4

When an azole-based corrosion inhibitor is included in a polishing composition to reduce copper corrosion, a primary organic residue defect remaining on copper surfaces after polishing is believed to be a complex formed from the copper ions removed during polishing and the azole-based corrosion inhibitor. Table 5 shows the solubility of this organic residue complex in each of Compositions 1-5 by measuring the copper ion concentration by ICP-MS in the supernatant of each composition after incubating a set amount of pre-prepared organic residue complex in each composition for a set period of time. Table 5 also shows defect count measurements, measured by a KLA-Tencor AIT-XUV, on copper blanket wafers after polishing with each of Compositions 1-5.

The results show that surprisingly the increase in the amount of organic solvent content dramatically increases the solubility of the organic residue complex. This leads to substantially reduced organic residue defect counts on copper blanket wafers after polishing with Compositions 2-5, when compared with Composition 1.

TABLE 5

| | Comp. 1 | Comp. 2 | Comp. 3 | Comp. 4 | Comp. 5 |
|---|---|---|---|---|---|
| Organic Solvent | Organic Solvent 1 (<0.2 wt %) | Organic Solvent 1 (>3 wt %) | Organic Solvent 2 (>3 wt %) | Organic Solvent 3 (>3 wt %) | Organic Solvent 4 (>3 wt %) |
| Cu (ppb) | 1895 | 19974 | 10378 | 21457 | 18967 |
| Organic Residue Defects | 345 | 47 | 87 | 57 | 72 |
| Scratch Defects | 343 | 262 | 351 | 285 | 315 |
| Total Defect Counts (TDC) | 688 | 312 | 444 | 342 | 387 |

Although only a few example embodiments have been described in detail above, those skilled in the art will readily appreciate that many modifications are possible in the example embodiments without materially departing from this invention. Accordingly, all such modifications are intended to be included within the scope of this disclosure as defined in the following claims.

What is claimed is:

1. A polishing composition, comprising:
- at least one abrasive in an amount of from about 0.1% to about 12% by weight of the composition;
- at least one organic acid or a salt thereof in an amount of from about 0.01% to about 1% by weight of the composition;
- at least one organic solvent in an amount of from about 4% to about 15% by weight of the composition;
- at least one non-ionic surfactant in an amount of from about 0.001% to about 1% by weight of the composition, wherein the at least one non-ionic surfactant comprises an alcohol alkoxylate, wherein the alkoxylate groups of the alcohol alkoxylate are propoxylate groups or a combination of ethoxylate and propoxylate groups; and
- an aqueous solvent in an amount of from about 70% to about 90% by weight of the composition,
- wherein the polishing composition has a pH of from about 7 to about 13.

2. The polishing composition of claim 1, wherein the at least one abrasive is selected from the group consisting of alumina, silica, titania, ceria, zirconia, co-formed products of alumina, silica, titania, ceria, or zirconia, coated abrasives, surface modified abrasives, and mixtures thereof.

3. The polishing composition of claim 1, wherein the at least one abrasive is in an amount of from about 0.5% to about 10% by weight of the composition.

4. The polishing composition of claim 1, wherein the at least one organic acid is selected from the group consisting of a carboxylic acid, an amino acid, a sulfonic acid, a phosphonic acid, and mixtures thereof.

5. The polishing composition of claim 1, wherein the at least one organic acid is selected from the group consisting of gluconic acid, lactic acid, citric acid, tartaric acid, malic acid, glycolic acid, malonic acid, formic acid, oxalic acid, acetic acid, propionic acid, peracetic acid, succinic acid, lactic acid, amino acetic acid, phenoxyacetic acid, bicine, diglycolic acid, glyceric acid, tricine, alanine, histidine, valine, phenylalanine, proline, glutamine, aspartic acid, glutamic acid, arginine, lysine, glycine, arginine, tyrosine, benzoic acid, 1,2-ethanedisulfonic acid, 4-amino-3-hydroxy-1-naphthalenesulfonic acid, 8-hydroxyquinoline-5-sulfonic acid, aminomethanesulfonic acid, benzenesulfonic acid, hydroxylamine O-sulfonic acid, methanesulfonic acid, m-xylene-4-sulfonic acid, poly(4-styrenesulfonic acid), polyanetholesulfonic acid, p-toluenesulfonic acid, trifluoromethane-sulfonic acid, phosphonic acid, hydroxyethylidene diphosphonic acid, 2-phosphono-1,2,4-butane tricarboxylic acid, aminotrimethylene phosphonic acid, hexamethylenediamine tetra(methylenephosphonic acid), bis(hexamethylene)triamine phosphonic acid, ethylenediaminetetracetic acid, iminodiacetic acid, N-hydroxyethyl-ethylenediaminetriacetic acid, nitrilotriacetic acid, diethylenetriaminepentacetic acid, hydroxyethylethylenediaminetriacetic acid, triethylenetetraaminehexaacetic acid, diaminocycloheanetetraacetic acid, nitrilotrimethylphosphonic acid, ethylenediaminetetra (methylenephosphonic acid), 1-hydroxyethylidene-1,1-diphosphonic acid, diethylenetriamine penta(methylene phosphonic acid), and mixtures thereof.

6. The polishing composition of claim 1, wherein the at least one organic acid or a salt thereof is in an amount of from about 0.005% to about 0.5% by weight of the composition.

7. The polishing composition of claim 1, wherein the at least one organic solvent is in an amount of from about 10% to about 15% by weight of the composition.

8. The polishing composition of claim 1, wherein the at least one organic solvent is selected from the group consisting of methanol, ethanol, 1-propanol, 2-propanol, 1-butanol, 2-butanol, t-butyl alcohol, 1-pentanol, 2-pentanol, 3-pentanol, cyclohexanol, ethylene glycol, propylene glycol, 2-methoxyethanol, 2-ethoxyethanol, 2-propoxyethanol, 2-isopropoxyethanol, 2-butoxyethanol, propylene glycol methyl ether, propylene glycol propyl ether, diethylene glycol butyl ether, ethylene glycol dimethyl ether, ethylene glycol diethyl ether, acetone, acetonitrile, dimethyl sulfoxide, dimethylformamide, dimethylacetamide, tetrahydrofuran, 1-methyl-2-pyrrolidone, 3-methyl-2-oxazolidinone, N,N'-dimethylimidazolidinone, ethylene carbonate, propylene carbonate, glycerol, diethylene glycol, diglyme, dioxane, morpholine, butanone, 2-pentanone, 3-pentanone, monoethanolamine, 2-(2-aminoethoxy) ethanol, 2-amino-2-methyl-1,3-propanediol, 2-amino-2-hydroxymethyl-propane-1,3-diol, piperazine, 1-(2-hydroxyethyl) piperazine, and any combinations thereof.

9. The polishing composition of claim 1, wherein the at least one organic solvent has a polarity index of from about 2 to about 10.

10. The polishing composition of claim 1, further comprising at least one azole compound.

11. The polishing composition of claim 10, wherein the at least one azole compound is selected from the group consisting of substituted or unsubstituted triazoles, substituted or unsubstituted tetrazoles, substituted or unsubstituted benzotriazoles, substituted or unsubstituted pyrazoles, substituted or unsubstituted imidazoles, substituted or unsubstituted benzimidazoles, substituted or unsubstituted thiadiazoles, substituted or unsubstituted adenines, substituted or unsubstituted xanthines, and substituted or unsubstituted guanines.

12. The polishing composition of claim 10, wherein the at least one azole compound is selected from the group consisting of 1,2,4-triazole, 1,2,3-triazole, tetrazole, benzotriazole, tolyltriazole, methyl benzotriazole, ethyl benzotriazole, propyl benzotriazole, butyl benzotriazole, pentyl benzotriazole, hexyl benzotriazole, dimethyl benzotriazole, chloro benzotriazole, dichloro benzotriazole, chloromethyl benzotriazole, chloroethyl benzotriazole, phenyl benzotriazole, benzyl benzotriazole, aminotriazole, aminobenzimidazole, aminotetrazole, pyrazole, imidazole, adenine, xanthine, guanine, benzimidazole, thiabendazole, 1-hydroxybenzotriazole, 2-methylbenzothiazole, 2-aminobenzimidazole, 2-amino-5-ethyl-1,3,4-thiadiazole, 3,5-diamino-1,2,4-triazole, 3-amino-5-methylpyrazole, 4-amino-4H-1,2,4-triazole and mixtures thereof.

13. The polishing composition of claim 10, wherein the at least one azole compound is in an amount of from about 0.001% to about 3% by weight of the composition.

14. The polishing composition of claim 1, wherein the at least one non-ionic surfactant is in an amount of from about 0.005% to about 0.5% by weight of the composition.

15. The polishing composition of claim 1, wherein the polishing composition has a pH of from about 7.5 to about 12.5.

16. A method, comprising:

applying the polishing composition of claim 1 to a substrate; and bringing a pad into contact with the surface of the substrate and moving the pad in relation to the substrate.

17. The method of claim 16, wherein the substrate comprises copper.

18. The method of claim 17, wherein the substrate further comprises cobalt or ruthenium.

19. The method of claim 16, further comprising forming a semiconductor device from the substrate.

* * * * *